United States Patent [19]

Horikawa et al.

[11] Patent Number: 5,640,089
[45] Date of Patent: Jun. 17, 1997

[54] METHOD AND APPARATUS FOR SURFACE ROUGHNESS DETECTION - USING A MAGNETORESISTIVE ELEMENT

[75] Inventors: Junichi Horikawa; Hisao Kawai, both of Yamanashi, Japan

[73] Assignee: Hoya Corporation, Tokyo, Japan

[21] Appl. No.: 526,646

[22] Filed: Sep. 11, 1995

[30] Foreign Application Priority Data

Sep. 12, 1994 [JP] Japan ................................. 6-217493

[51] Int. Cl.[6] ............................. G01B 7/34; G01R 33/12; G01N 27/72
[52] U.S. Cl. ........................... 324/212; 73/105; 324/235; 324/252
[58] Field of Search .................... 324/210–212, 324/235, 252; 360/113; 369/58; 73/86, 105, 150

[56] References Cited

U.S. PATENT DOCUMENTS

| | | |
|---|---|---|
| 4,416,144 | 11/1983 | Chen et al. ........................ 73/12.09 |
| 4,532,802 | 8/1985 | Yeack-Scranton et al. ........ 324/212 X |
| 5,410,439 | 4/1995 | Egbert et al. ....................... 324/212 X |
| 5,455,730 | 10/1995 | Dovek et al. ......................... 360/113 |

*Primary Examiner*—Gerard R. Strecker
*Attorney, Agent, or Firm*—Sughrue, Mion, Zinn, Macpeak & Seas

[57] ABSTRACT

A magnetoresistive element is used to detect a surface roughness of an object, such as a magnetic recording medium, a photomask blank, a semiconductor wafer, and is assembled into a reproducing head which moves along a surface of the object and which can produce an electric signal related to the surface roughness. The reproducing head may be incorporated with a recording head into a head unit. The head unit can monitor a magnetic characteristic of the magnetic recording medium in addition to detection of the surface roughness, by recording a predetermined signal by the recording head and by reproducing the predetermined signal by the reproducing head.

14 Claims, 8 Drawing Sheets

FIG. 1(A)
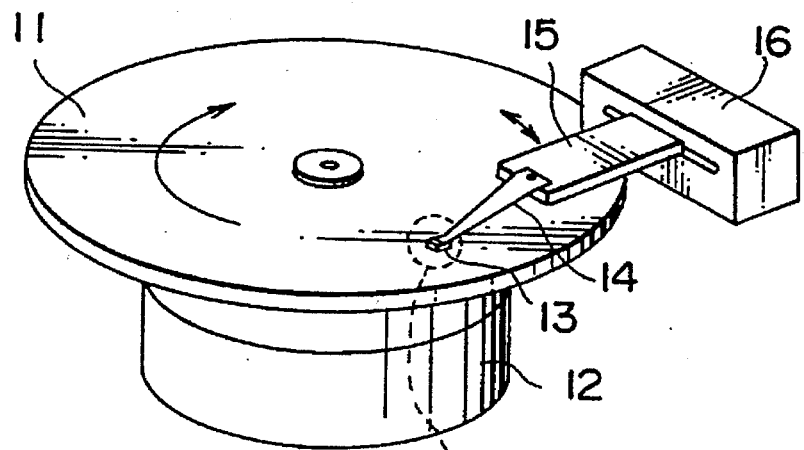
FIG. 1(B)
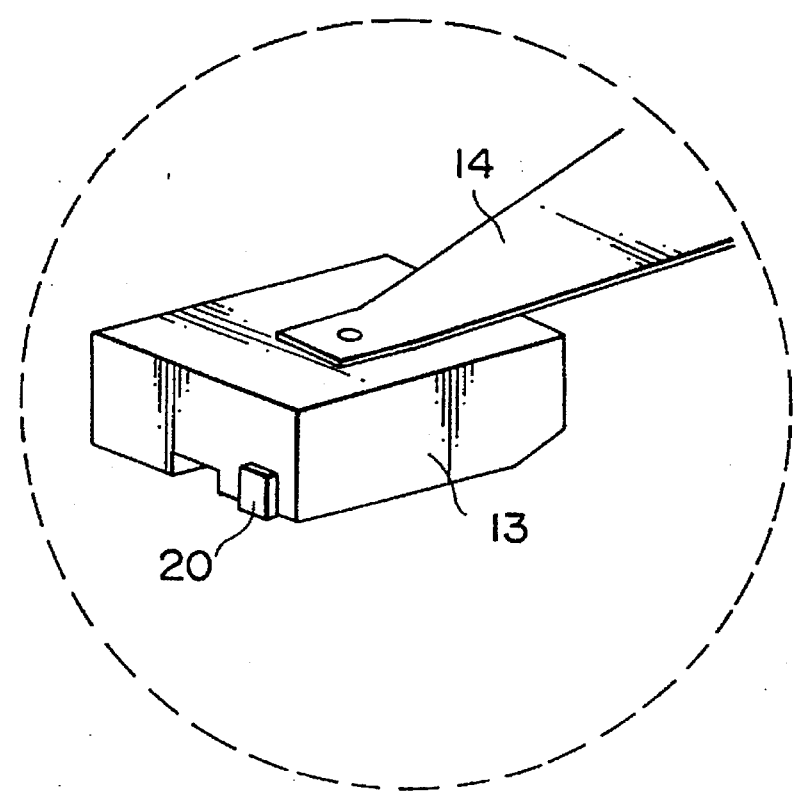
FIG. 1(B)

5,640,089

METHOD AND APPARATUS FOR SURFACE ROUGHNESS DETECTION - USING A MAGNETORESISTIVE ELEMENT

BACKGROUND OF THE INVENTION

This invention relates to a device and a method for use in detecting a surface roughness of an object surface of an object. It is to be noted throughout the instant specification that the object to be detected may be a magnetic recording medium, a semiconductor wafer, a photomask blank, a photomask, or the like, although the following description will be directed mainly to the magnetic recording medium used in a magnetic recording/reproducing device.

Heretofore, it has been required to extremely flatten a surface of a magnetic recording medium, such as a magnetic disk, which has a disk shaped substrate of, for example, glass, aluminum, and a magnetic film formed on the disk shaped substrate. This is because protrusions, recessions, and/or damages, which determine a surface roughness on a surface of the magnetic recording medium, bring about bad influences on recording or reproducing information signals recorded on the magnetic recording medium and often give rise to destruction of a magnetic recording/reproducing device.

More specifically, a head slider is used on recording on or reproducing from the magnetic recording medium and is caused to float above the magnetic recording medium during the recording or the reproducing, with a gap left between the magnetic recording medium and the head slider on the order of submicron and to travel all over the magnetic recording medium. Under the circumstances, when large protrusions or recessions are present on a surface of the magnetic recording medium, the recording or reproducing often becomes difficult at positions of such protrusions and recessions. On the other hand, the head slider may collide with the protrusions and, as a result, may bring about destruction of the head slider and the magnetic recording medium.

To this end, the surface roughness of the magnetic recording medium should be precisely tested or monitored after the magnetic recording medium is manufactured. This applies to a photomask, a semiconductor wafer, and so on.

Herein, it is to be noted that the magnetic recording medium is usually tested by a glide test and a certifying test so as to investigate the surface roughness and to insure a magnetic characteristic of the magnetic recording medium, respectively. In any event, such glide and certifying tests should be quickly made over a whole surface of the magnetic recording medium that is very wide.

Practically, a wide surface, such as the surface of the magnetic recording medium can not be tested by using a probe for touching the surface from a point to another point or a needle for measuring a tunnel current because use of such a probe or a needle undesirably lengthens a test time.

Taking this into consideration, a method for the glide test has been proposed which uses a glide head including a head slider and a piezo electric element attached to the head slider. In this case, the glide head travels above the surface of the magnetic recording medium. With this structure, an electric signal which corresponds to the surface roughness of the magnetic recording medium can be extracted from the piezo electric element.

However, it should be considered that the piezo electric element itself has a size and a weight which are not negligible in comparison with those of the head slider. This means that a flight state of the head slider does not always faithfully represent a state of the surface of the magnetic recording medium, which makes a measurement error large. As a result, the measurement error is not negligible when the piezo electric element is used.

In addition, it is a recent trend that the head slider becomes small in size. Therefore, such a small head slider makes it difficult to mount the piezo electric element.

An alternative method has been also proposed which uses a glide head including a head slider, a support arm attached to the head slider to support the head slider, and an acoustic emission (AE) sensor mounted on the support arm. With this structure, no problem takes place as regards a size and a weight of the acoustic emission (AE) sensor because the AE sensor is not directly attached to the head slider and is remote from the head slider.

However, a movement or vibration of the head slider is indirectly transmitted through the support arm to the AE sensor. Therefore, the vibration of the head slider can not be faithfully transmitted to the AE sensor. This means that a measurement error is included in a measurement result of the AE sensor.

Furthermore, the certifying test has been also conducted by the use of a head slider which is different from that used in the glide test. The head slider for the certifying test has a magnetic head for recording and reproducing information signals on or from the magnetic recording medium. In other words, the magnetic head for the certifying test should have recording and reproducing functions.

From this fact, it is readily understood that different head sliders should be prepared so as to make the glide and the certifying tests.

SUMMARY OF THE INVENTION

It is an object of this invention to provide a method which is capable of detecting a surface roughness on an object and which is applicable to both a nonmagnetic medium and a magnetic recording medium.

It is another object of this invention to provide a device which can quickly and faithfully detect the surface roughness on testing the object surface and which is small in size and light in weight.

It is still another object of this invention to provide a device of the type described, which can be used in common to both a glide test and a certifying test.

According to an aspect of this invention, a surface roughness detecting method comprises the steps of preparing a motion unit which has a magnetoresistive element, preparing an object which has a surface having a surface roughness, moving the motion unit along the surface to derive, through the magnetoresistive element, an electric signal which is related to the surface roughness, and detecting the surface roughness from the electric signal. Thus, the magnetoresistive element serves to detect the surface roughness determined by protrusions, recessions, and damages formed on the surface. In addition, the magnetoresistive element also serves to determine a magnetic characteristic of the object when it can detect a predetermined signal recorded by a recording head.

According to another aspect of this invention, a surface roughness detecting device is for use in detecting a surface roughness on an object surface of an object. The detecting device comprises a motion unit which is movable along the object surface and which includes a magnetoresistive element for picking up an electric signal related to the surface roughness and an electric circuit electrically coupled to the magnetoresistive element for detecting the surface roughness from the electric signal.

BRIEF DESCRIPTION OF THE DRAWING

FIGS. I(A) and (B) show a perspective view and an enlarged view for use in describing a part of a surface roughness detecting device according to this invention.

DESCRIPTION OF THE PREFERRED EMBODIMENTS

Figure 2:
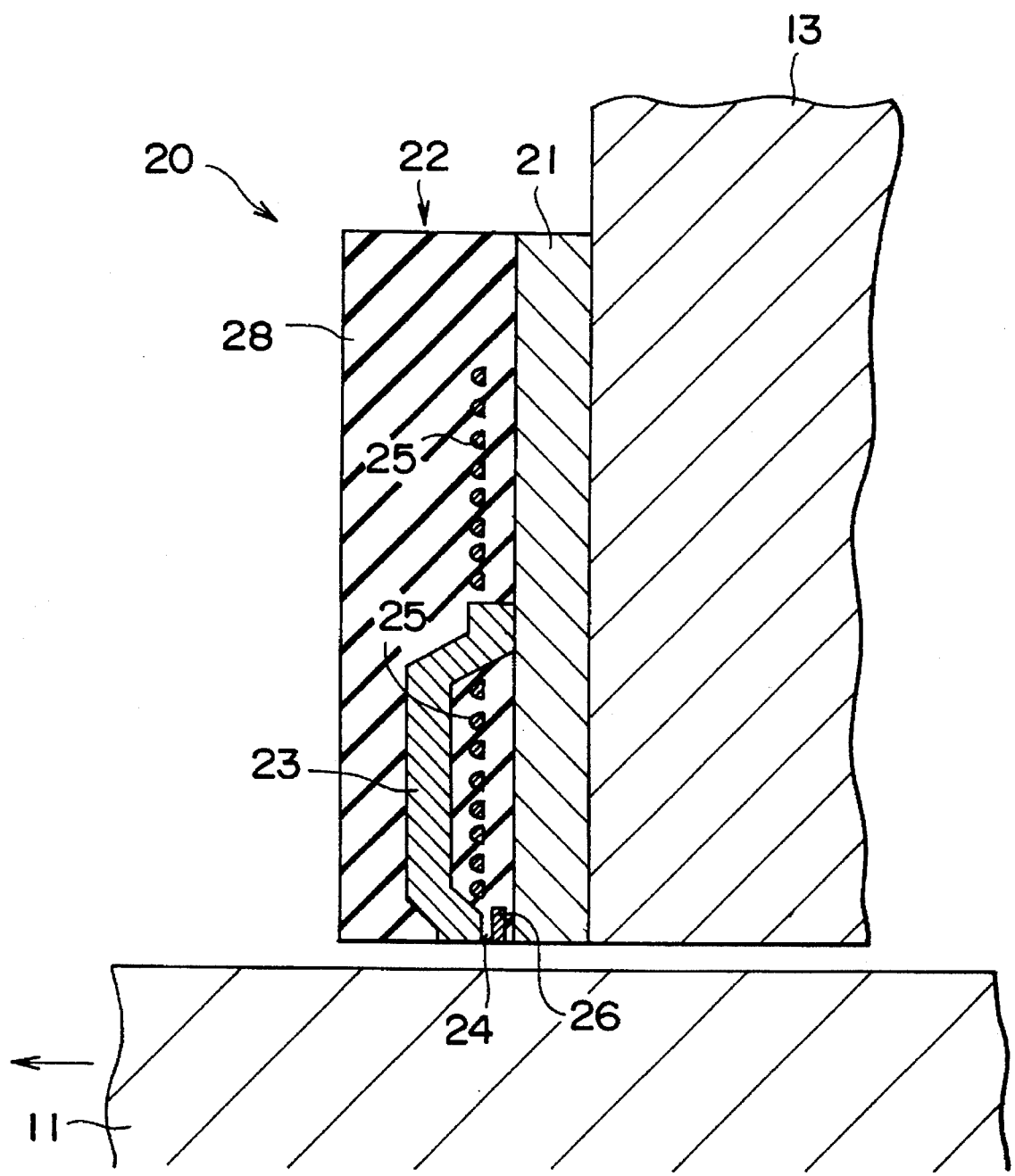
FIG. 2 is a sectional view which partially enlarges the part enlarged in FIG. 1(B) to describe a surface roughness detecting device according to a first embodiment of this invention.

Referring to FIGS. 1(A) and 1(B), a surface roughness detecting device according to a first embodiment of this invention is for use in detecting a surface roughness of a magnetic recording medium, namely, a magnetic disk 11 as an object to be detected, on testing the magnetic disk 11. In particular, the illustrated surface roughness detecting device is very suitable for detecting a projection or a protrusion which appears on the magnetic disk 11, although this invention is not restricted to detection of the projection.

The magnetic disk 11 is placed on a rotation table 12 which is rotated around a center axis thereof in a predetermined direction depicted by an arrow head in FIG. 1 (A).

In the illustrated example, a glide head rests over the magnetic disk 11 and includes a head slider 13 as shown in FIG. 2(B), a suspension 14 for supporting the head slider 13, a head mount member 15 attached to the suspension 14, and a movement mechanism 16 for moving the head mount member 15 in both forward and backward directions, as depicted by an arrow in FIG. I(A). Specifically, the head slider 13 is forced to be pressed towards the magnetic disk 14 by the suspension 14 so as to provide suitable force on the magnetic disk 11. The head mount member 15 is supported by the movement mechanism 16 so that the head mount member 15 can be moved in a radial direction of the magnetic disk 11.

With this structure, when the magnetic disk 11 is rotated on the rotation table 12 along the direction depicted by the arrow at a speed higher than a predetermined speed, the head slider 13 floats over the surface of the magnetic disk 11 to travel along the magnetic disk 11, by the virtue of an air flow caused to occur between the surface of the magnetic disk 11 and a bottom surface of the head slider 13. In addition, simultaneous movement of the head mount member 15 along the radial direction due to the movement mechanism 16 makes it possible to move the head slider 13 all over the surface of the magnetic disk 11.

Herein, it is to be noted that the rotation table 12 and the movement mechanism 16 are controlled by a control device (not shown).

In FIG. 1(B), the head slider 13 is attached or fixed to an end of the suspension 14 and substantially has a rectangular shape defined by front and back surfaces, upper and lower surfaces, and side surfaces. As shown in FIG. 1(B), a composite magnetic head portion 20 is attached to the front surface of the head slider 13. The illustrated composite magnetic head portion 20 is adjacent to one of the side surfaces of the head slider 13 and is thus biased on one side surface side of the head slider 13. For convenience of description, a combination of the head slider 13 and the composite magnetic head portion 20 will be referred to as a motion unit.

Referring to FIG. 2 together with FIGS. 1(A) and 1(B), the composite magnetic head portion 20 includes a ferrite base 21 of Mn—Zn attached to the end of the head slider 13 and a head unit 22 mounted on the ferrite base 21. The head unit 22 includes an amorphous core 23 of CoZrNbTa which has an upper end, a lower end, and an intermediate portion between the upper and the lower ends. The upper end of the amorphous core 23 is fixed to the ferrite base 21 while the lower end of the amorphous core 23 is very close to the magnetic disk 11 and faced with the ferrite base 21 with a magnetic gap 24 left between the ferrite base 21 and the lower end of the amorphous core 23, as shown in FIG. 2. A coil 25 for an inductive magnetic head is wound around the amorphous core 23, as illustrated in FIG. 2, and may be composed of a plurality of coil layers. The coil 25 is electrically connected to a control circuit through electrodes (not shown) of the coil 25 to a control circuit. The amorphous core 23, the coil 25, and the magnetoresistive element 26 are placed to form a recording head portion within an insulator block or film 28 which is composed of $Al_2O_3$ and which is attached to the ferrite base 21. The illustrated recording head portion provides an inductive magnetic head portion.

In the example illustrated, a magnetoresistive element 26 of a thin film type is located within the magnetic gap 24 and is electrically connected to the control circuit, as will be illustrated later. With this structure, it is possible to magnetically shield the magnetoresistive element 26 and to form an inductive magnetic head by the amorphous core 23, the magnetic gap 24, and the coil 25. In this event, the inductive magnetic head serves to write an information signal into the magnetic disk 11. On the other hand, the magneto-resistive element 26 is supplied with a bias magnetic field within the magnetic gap and is operable as a magnetoresistive magnetic head portion of a thin film type for reproducing or reading an information signal from the magnetic disk 11. Therefore, the magnetoresistive magnetic head portion may be referred to as a reproducing head portion. At any rate, the reproducing head portion is incorporated with the recording head portion into the head unit 22.

Herein, let the description be made about the magnetoresistive element 26 of the thin film type in detail. Simply, the magnetoresistive element 26 is operable to detect a magnetic field generated from magnetic poles of the magnetic disk 11 by using an anisotropic magnetoresistance effect of a material, such as Ni—Co alloy, Ni—Fe alloy, or the like. The anisotropic magnetoresistive effect may be defined as a phenomenon that electrical resistivity of a material is varied in dependency upon an angle between a direction of an electric current and a direction of magnetization.

Figure 3:
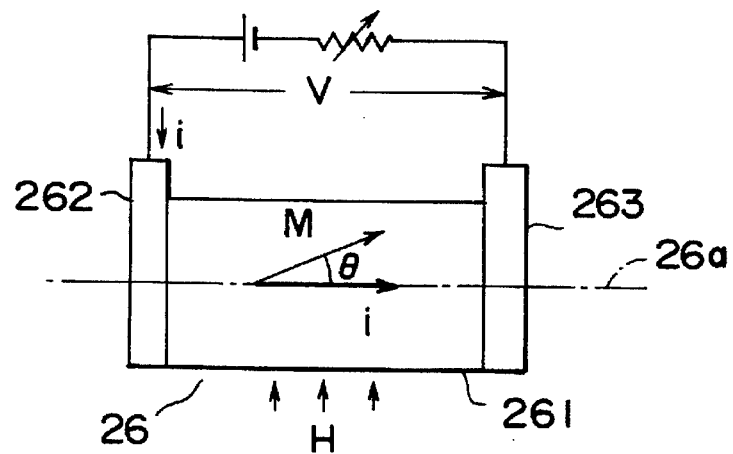
FIG. 3 is a circuit diagram for use in describing an operation of the surface roughness detecting device illustrated in FIG. 2.

Referring to FIG. 3, the anisotropic magnetoresistance effect will be described for a better understanding of this invention. In FIG. 3, the illustrated magnetoresistive element 26 of the thin film type has a magnetoresistive body 261 and electrodes 262 and 263 attached to both ends of the magnetoresistive body 261. The magnetoresistive body 261 has the electrical resistivity (represented by $\rho$) and an axis of easy magnetization 26a extended between the electrodes 262 and is located so that the axis of easy magnetization crosses a magnetic field (depicted by H) generated from the magnetic disk 11. A series circuit of a d.c. voltage source and a variable resistor is connected between the electrodes 262 and 263 to supply a d.c. voltage v across the electrodes 262 and 263 and to cause the electric current (depicted by i) to flow through the magnetoresistive body 261.

Under the circumstances, the voltage V across the electrodes 262 and 263 is proportional to a product of the electric current i and the electrical resistivity $\rho$ when the electric current i is caused to flow in parallel with the axis of easy magnetization. However, it is noted that the electrical resistivity $\rho$ is variable in dependency upon the direction of the electric current i and strength of the magnetic field H perpendicular to the electric current i. Specifically, a direction (M) of magnetization is varied relative to the direction of the electric current i in the magnetoresistive body 261 in accordance with the strength of the magnetic field H. This shows that the variation of the magnetic field H brings about a variation of an angle $\theta$ between the direction of the electric current i and the direction (M) of the magnetization in the magnetoresistive body 261. As a result, the electrical resistivity $\rho$ is given in relation to the angle $\theta$ by:

$$\rho = \rho_0 + \Delta\rho_m \cos^2\theta, \qquad (1)$$

where $\rho_0$ represents the electrical resistivity of the magnetoresistive body 261 appearing when H=0; and $\Delta\rho_m$, a maximum variation amount of the electrical resistivity $\rho$.

From Equation (1), it is readily understood that the variation of the magnetic field H appears as the variation of the electrical resistivity $\rho$ which gives rise to the variation of the voltage V. Therefore, it is possible to detect the variation of the magnetic field H by measuring or monitoring the variation of the voltage V across the magnetoresistive body 261.

Figure 4:
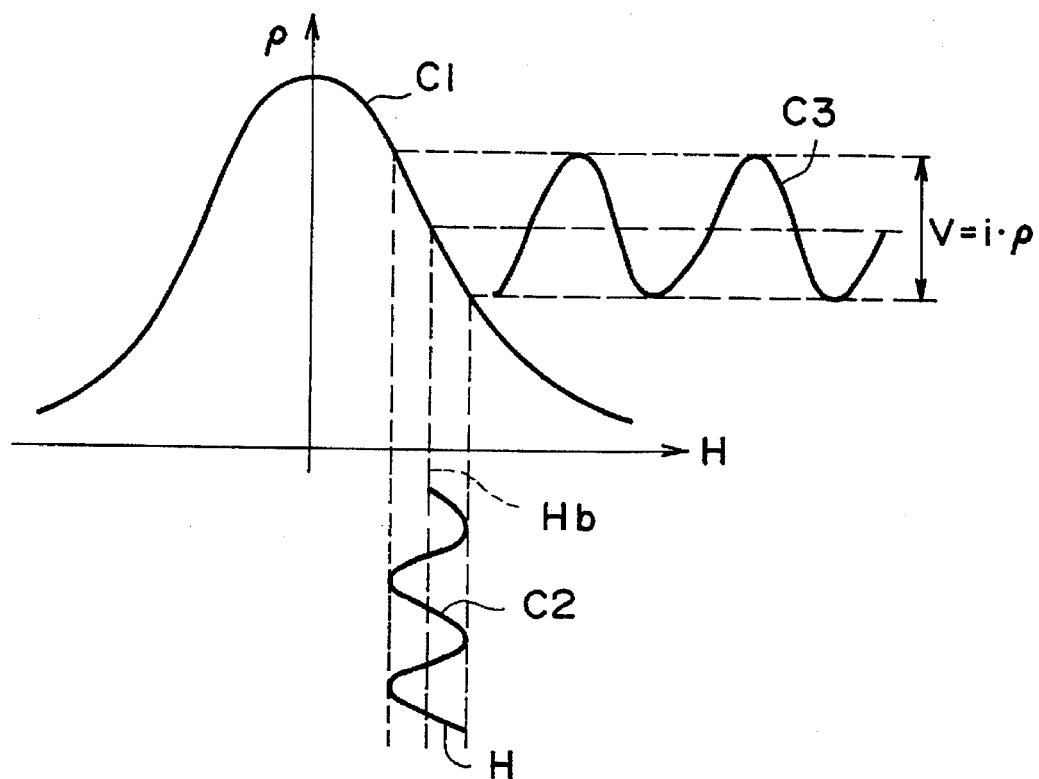
FIG. 4 shows a view for describing a characteristic of the surface roughness detecting device illustrated in FIG. 2.

Referring to FIG. 4, a curve C1 shows a relationship between the strength of the magnetic field H and the electrical resistivity $\rho$ As is apparent from the curve C1, the electrical resistivity $\rho$ becomes a maximum when H=0 and is gradually reduced as the magnetic field H is positively or negatively increased. Thus, the electrical resistivity $\rho$ in the magnetoresistive body 261 depends on the strength of the magnetic field H.

Taking the above into consideration, a bias magnetic field Hb is practically imposed on the magnetoresistive body 261, as shown in FIG. 4. The bias magnetic field Hb is selected at a position of the curve C1 at which the electrical resistivity $\rho$ is greatly varied. Herein, it is assumed that the magnetic field H of the magnetic disk 11 is varied, as shown by a curve C2, with the bias magnetic field Hb imposed on the magnetoresistive body 261. In this case, the voltage V across the electrodes 262 and 263 which is given by a product of the electric current i and the electrical resistivity $\rho$ is varied as shown by a curve C3. Thus, the magnetic field H of the magnetic disk 11 can be detected as the variation of the voltage V. Practically, the magnetoresistive body 261 may be formed by a magnetoresistive film of permalloy which has a thickness of 30 nm.

As mentioned before, the composite magnetic head portion 20 illustrated in FIG. 2 is operable as both the recording magnetic head and the reading magnetic head. This means that the illustrated composite magnetic head portion 20 is available for both the glide test and the certifying test. In other words, both the glide and the certifying tests can be executed by a single test or process when the composite magnetic head portion 20 is used.

For an understanding of this invention, description will be made about the certifying test. In the certifying test, a sequence of reference signals is recorded by a recording head on a magnetic disk and is thereafter read out of the magnetic disk as a readout or a reproduced signal sequence. Thereafter, it is judged by the use of the reproduced signal sequence whether or not any magnetic defects are present on the magnetic disk. Thus, the head used for the certifying test should have writing and reading functions, like in the composite magnetic head portion 20 illustrated in FIG. 2.

Now, let both the glide and the certifying tests be made by the use of the composite magnetic head portion 20 in a single process.

In this event, a sequence of reference signals is at first successively recorded on the magnetic disk 11 as a recorded reference signal sequence by using the inductive magnetic head function of the composite magnetic head portion 20. Thereafter, the recorded reference signal sequence is read out of the magnetic disk 11 as a readout reference signal sequence by using the readout magnetic function of the composite magnetic head portion 20.

Figure 5A:
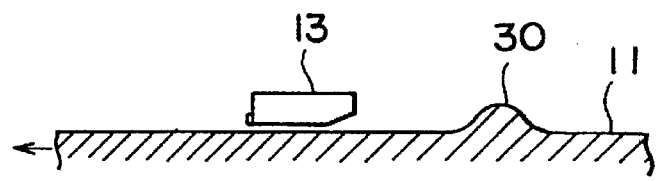
FIGS. 5(A) to (C) show views for describing movement of the head slider used in the surface roughness detecting device shown in FIG. 2.
Figure 5B:
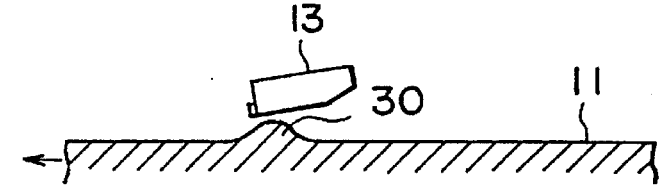
Figure 5C:
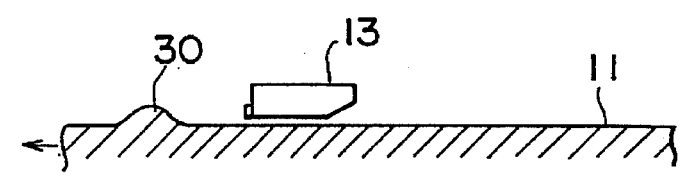

Referring to FIGS. 5(A) to (C), the head slider 13 glides along the magnetic disk 11 which has a protrusion 30 on the surface thereof. The head slider 13 travels along a flat portion of the surface of the magnetic disk 11, as shown in FIG. 5(A), and approaches the protrusion 30, as shown in FIG. 5(B). Subsequently, the head slider 13 passes the protrusion 30 and thereafter runs along a flat portion of the magnetic disk 11 again. Under the circumstances, it is assumed that the reproduced reference signal sequence is read out of the magnetic disk 11 as illustrated in FIGS. 5(A) to (C).

Figure 6:
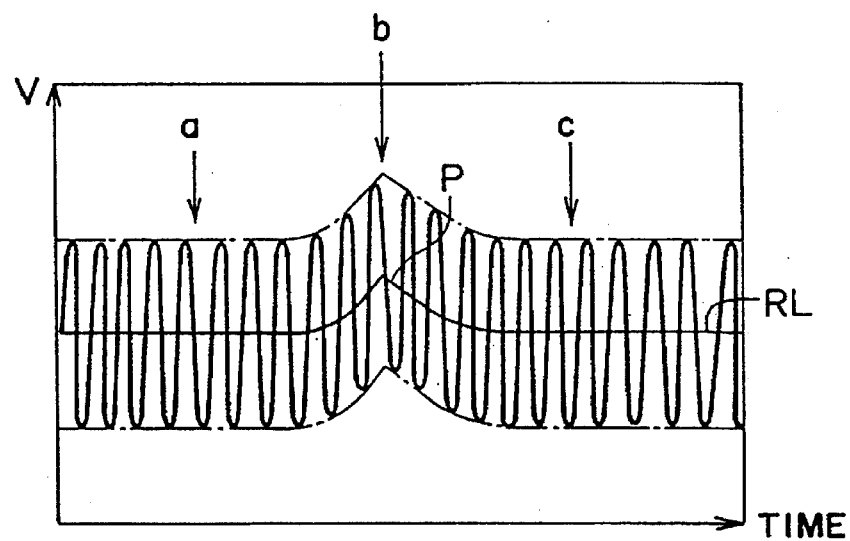
FIG. 6 show a waveform of an electric signal obtained by the movement illustrated in FIGS. 5(A) to (C)

Referring to FIG. 6, the reproduced reference signal sequence is obtained from the magnetic disk 11 when the head slider 13 glides along the surface of the magnetic disk 11 shown in FIGS. 5(A) to (C). Specifically, the reproduced reference signal sequence has a reference level RL and an a.c. signal component superposed on the reference level RL.

While the head slider 13 travels along the flat portion of the magnetic disk 11, as illustrated in FIG. 5(A), the reference level RL is kept unchanged and amplitudes of the reproduced reference signal sequence are not changed, as depicted at a in FIG. 6. On the other hand, when the head slider 13 encounters the protrusion 30, as illustrated in FIG. 5(B), the reference level RL is raised up together with the a.c. signal component, as depicted at b in FIG. 6. As a result, the reference level RL exhibits a peak P at a portion of the protrusion 30 and is given by a d.c. level. After the head slider 13 passes the protrusion 30 and glides along the flat portion of the magnetic disk 11, the reference level RL returns back to a previous level together with the a.c. signal component, as depicted at c in FIG. 6.

Figure 7:
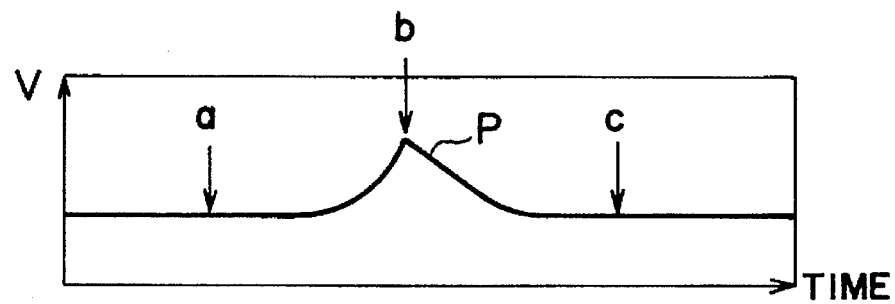
FIG. 7 shows a waveform of a signal extracted from the electric signal shown in FIG. 6.

Referring to FIG. 7, the a.c. signal component alone is extracted as a detection signal and reproduced with the d.c. level erased from the a.c. signal component and has a peak P at a time instant b at which the head slider 13 passes the protrusion 30. This means that it is possible by monitoring the detection not only to detect existence or nonexistence of protrusions but also to confirm whether or not magnetic defects are present on the magnetic disk 11. Similar results can be obtained by erasing the a.c. signal component and by leaving the d.c. level as the detection signal.

Practically, when the protrusion 30 has a substantial circular configuration which has a height of about 30 nm and a diameter of about 50 nm, the detection signal which is extracted in relation to the protrusion 30 has been obtained which has a peak level between several mV and several tens of mV. In addition, it has been confirmed that the peak level of the detection signal is varied in dependency upon relative velocities between the magnetic disk 11 and the head slider 13 and upon a floating height of the head slider 13.

Figure 8:
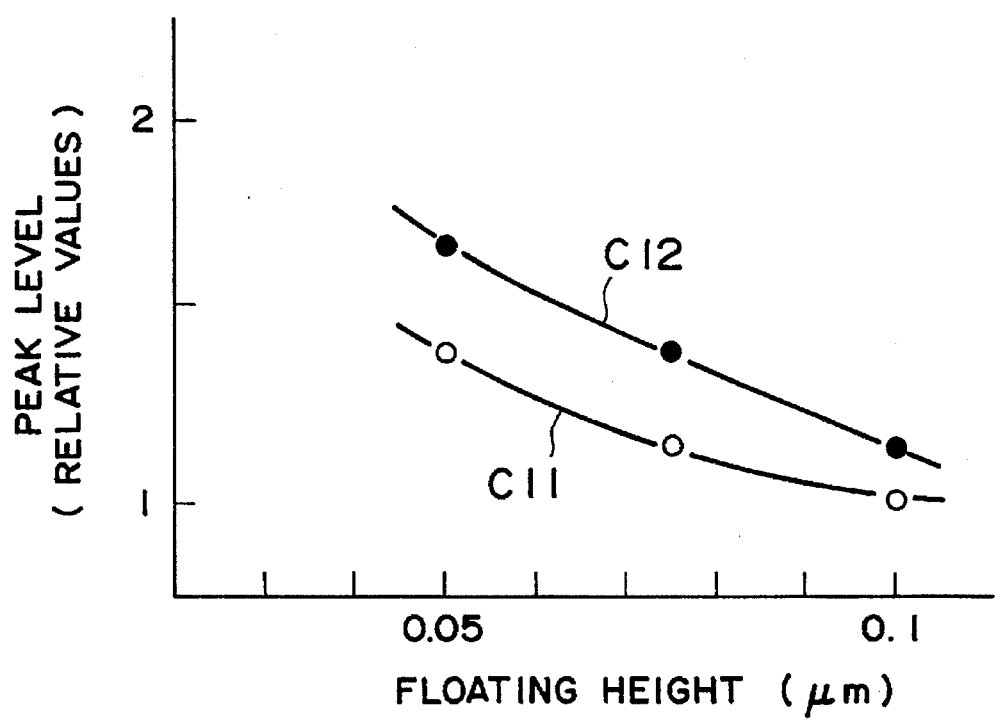
FIG. 8 shows a view for use in describing variations of the peak levels of the signal illustrated in FIG. 7.

Referring to FIG. 8, curves C11 and C12 show relationships between the floating heights (micronmeter) of the head slider 13 and the peak levels of the detection signal. As shown in FIG. 8, the floating heights and the peak levels are taken along the abscissa and the ordinate of FIG. 8, respectively.

The peak levels are represented by relative values in FIG. 8. Specifically, when the relative velocities between the magnetic disk 11 and the head slider 13 are equal to 5 m/sec and 6 m/sec, the relationships between the floating heights and the peak levels are specified by the curves C11 and C12, respectively. As is apparent from the curves C11 and C12, the peak levels of the detection signal become low when the floating heights become high. In addition, the peak levels become high as the relative velocities increase.

At any rate, the head slider 13 illustrated in FIG. 2 can carry out both the glide test and the certifying test simultaneously by a single test.

Figure 9:
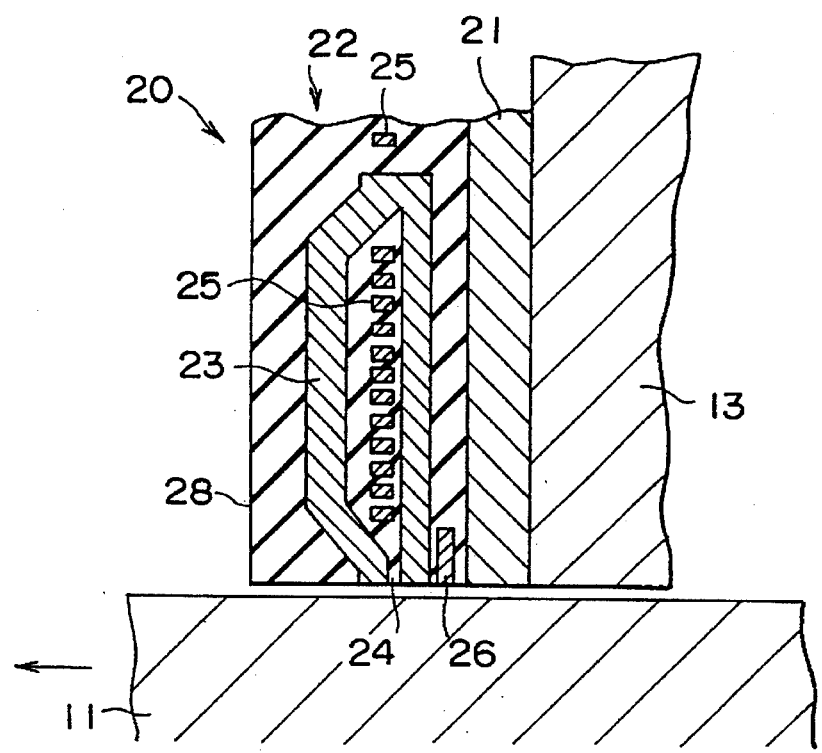
FIG. 9 shows a sectional view of a surface roughness detecting device according to a second embodiment of this invention.

Referring to FIG. 9, a composite magnetic head portion 20 according to a second embodiment of this invention is similar in structure to that illustrated in FIG. 2 except that the magnetoresistive element 26 is located outside of the magnetic gap 24 which is formed by the amorphous core 23. In this connection, the magnetoresistive element 26 is positioned between the amorphous core 23 and the ferrite base 21 and is buried within the insulator portion 28 to be fixed therein while the amorphous core 23 is not attached to the ferrite base 21.

With this structure, it is possible to accomplish an operation similar to that illustrated in FIG. 2 because the composite magnetic head portion 20 serves as both recording and reading heads, like in FIG. 2.

The magnetoresistive element 26 may be composed of a material which exhibits the anisotropic magnetoresistance effect. Accordingly, permalloy may be replaced by an alloy of, for example, Ni—Co, Ni—Fe, or by a stacked layer of different materials. Furthermore, the magnetoresistive element 26 may be implemented by a spin valve type or may utilize a giant magnetoresistance effect.

Figure 10A:
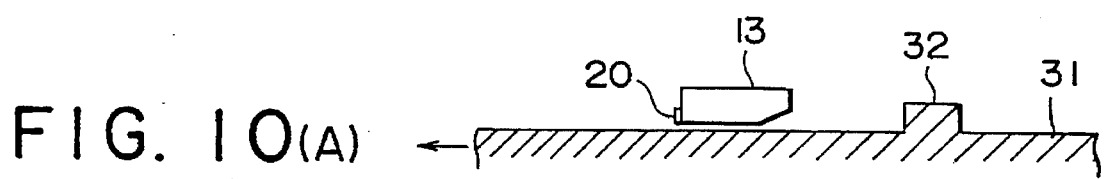
FIGS. 10(A) to (C) show views for describing movement of the head slider used in the surface roughness detecting device illustrated in FIG. 9.
Figure 10B:
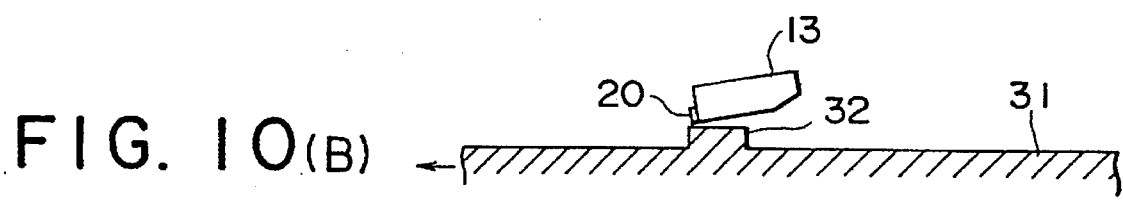
Figure 10C:
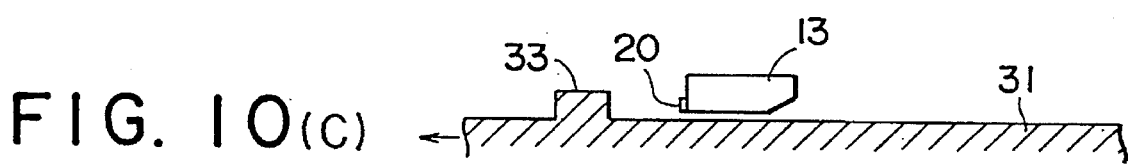

Referring to FIGS. 10(A) to (C), a substrate 31 which has no magnetic layer is tested by the use of the head slider 13 illustrated in FIGS. 2 and 9. The illustrated substrate 31 has a glass base and a protrusion 32 intentionally formed on the glass base by a photoetching technique and may be called a bump disk. Such an intentional protrusion 32 can be also detected by the head slider 13 to which the composite magnetic head portion 20 illustrated in FIGS. 2 and 9 are attached, like in FIGS. 5 through 7.

More specifically, the head slider 13 with the composite magnetic head portion 20 glides along a flat portion of the bump disk 31, as shown in FIG. 10(A), and approaches the intentional protrusion 32. Thereafter, the head slider 13 floats above the intentional protrusion 32, as shown in FIG. 10(B) and passes the same, as illustrated in FIG. 10(C).

Figure 11:
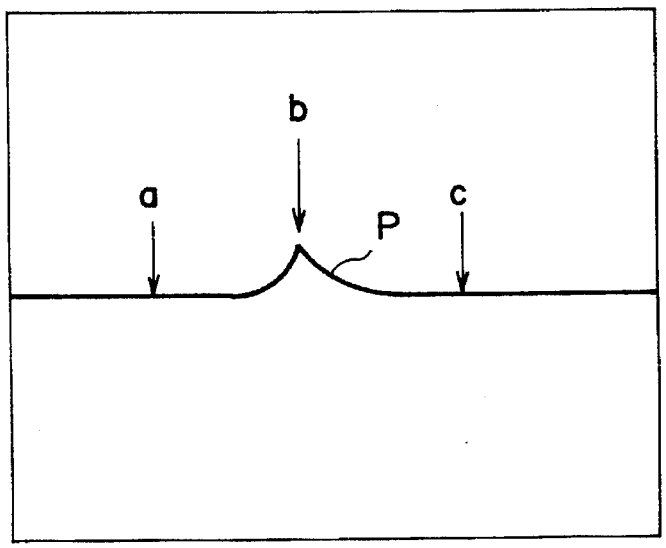
FIG. 11 shows a waveform for use in describing a signal obtained by the movement illustrated in FIG. 10(A) to (C)

Referring to FIG. 11, the composite magnetic head portion 20 illustrated in FIGS. 10(A) to (C) produces a detection signal in a manner similar to that illustrated with reference to FIGS. 6 and 7. Specifically, the detection signal can be obtained by erasing either the d.c. level or the a.c. signal component. The detection signal has a constant level a, a variable level b, and a constant level c which are obtained in the states illustrated in FIGS. 10(A) to (C), respectively. In particular, the variable level b exhibits a peak level p like in FIG. 7. As a result, the intentional protrusion 32 is detected by the composite magnetic head portion 20 according to this invention.

Practically, when the intentional protrusion 32 has a rectangular shape of 40 nm high and 50,000 nm wide, it has been confirmed that the detection signal has the peak level between several tens of μV and several mV.

Figure 12:
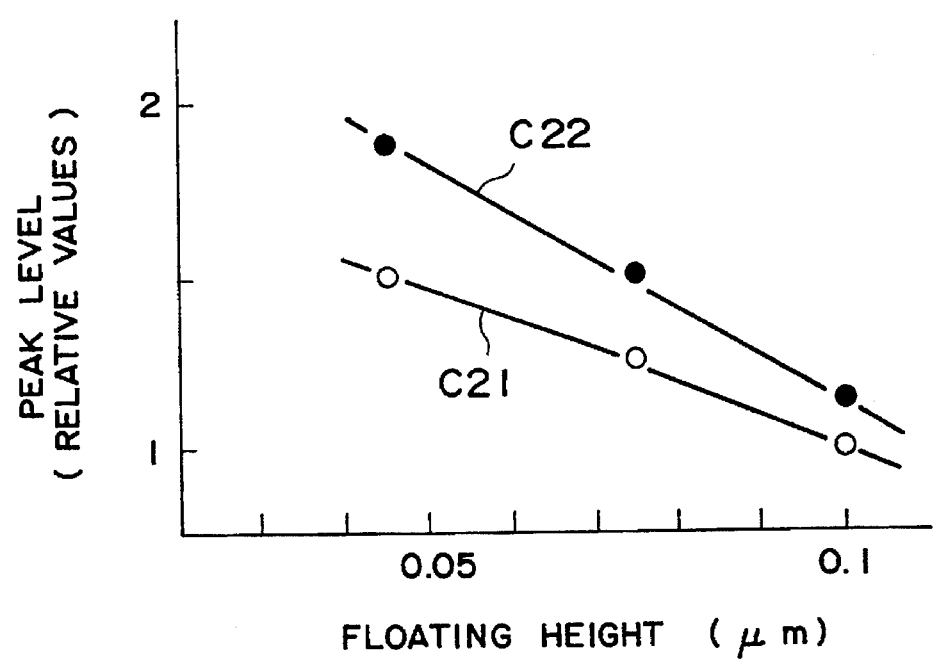
FIG. 12 shows a characteristic of the surface roughness detecting device illustrated in FIG. 9.

Referring to FIG. 12, curves C21 and C22 show relationships between the floating heights of the head slider 13 and the peak levels of the detection signals in consideration of relative velocities between the bump disk 31 and the head slider 13. Specifically, when the relative velocity is equal to 6 m/sec, the relationship is varied in accordance with the curve C21. When the relative velocity is increased to 7 m/sec, the relationship is varied in accordance with the curve C22.

Like in FIG. 8, the peak levels of the detection signal become low as the floating heights become high. Moreover, the peak levels become high with an increase of the relative velocities.

Figure 13:
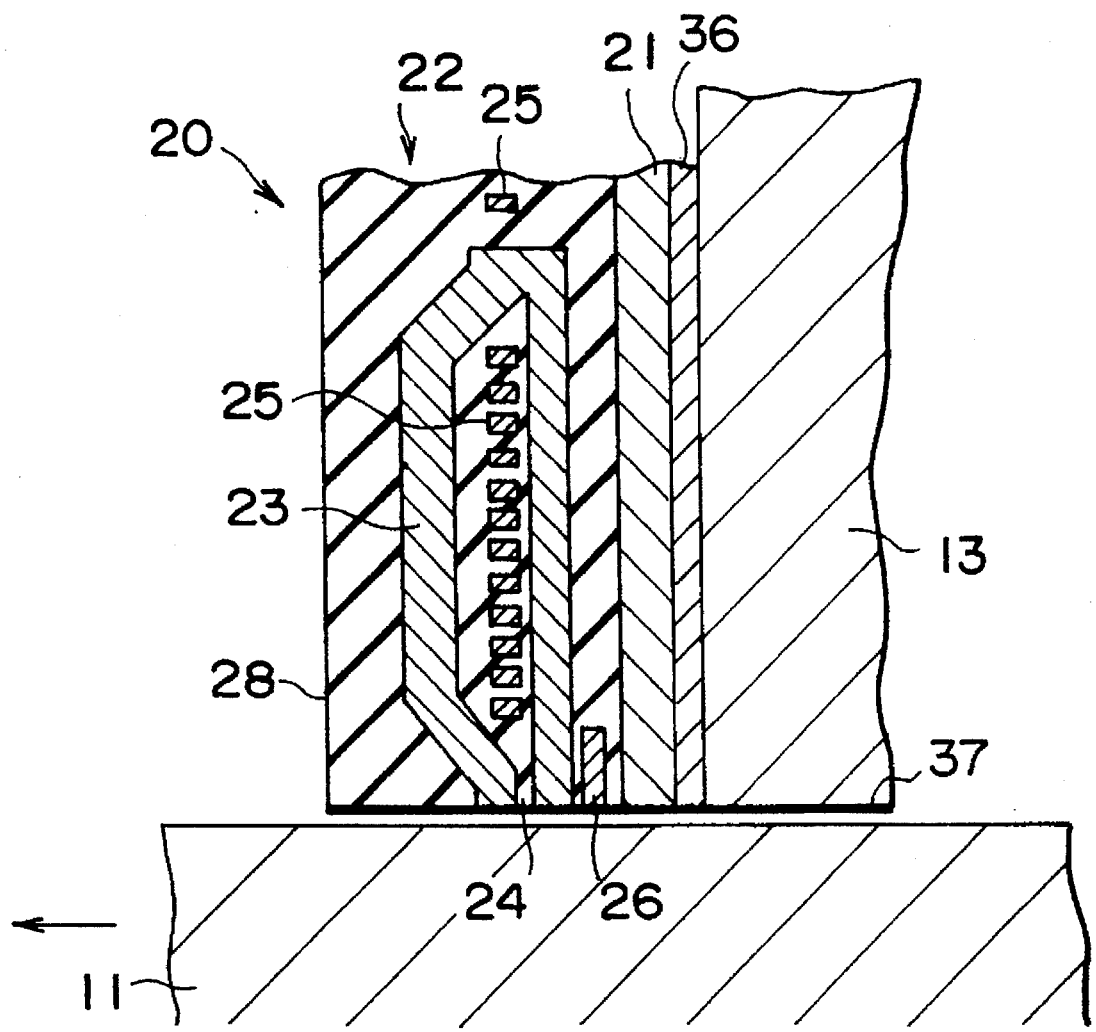
FIG. 13 shows a sectional view of a surface roughness detecting device according to a third embodiment of this invention.

Referring to FIG. 13, a composite magnetic head portion 20 according to a third embodiment of this invention is similar in structure and operation to that illustrated in FIG. 9 except that an intermediate layer 36 is interposed between the base 21 and the head slider 13 and a protection film 37 is coated on a surface of the head unit 22 and the head slider 13 which is directed towards the magnetic disk 11. The base 21 may be formed by a high permeability material, such as permalloy (FeNi), FeAlSi.

With this structure also, it is possible to accomplish similar operation and characteristic, like in FIGS. 2 and 9.

According to inventors' experimental studies, it has been found out that the magnetoresistive element serves to detect the surface roughness determined by protrusions, recessions, any other damages, even when the object to be detected does not generate any magnetic field. In other words, even when only the reproducing head which includes the magnetoresistive element is arranged in the head unit 22, the surface roughness can be detected by the magnetoresistive element. The reason can not be precisely analyzed for the time being. However, the inventors have now supposed that a mechanical shock is given to the magnetoresistive element 26 and somewhat deforms the magnetoresistive element 26 passes protrusions or recessions and that such deformation brings about an inverse magnetostrictive effect and gives rise to a variation of a current which is caused to flow through the magnetoresistive element. In addition, another supposition is that the mechanical shock which is given to the magnetoresistive element is converted into thermal energy which may bring about a variation of electrical resistivity and an anisotropic constant of the magnetoresistive element and which may result in the variation of the current flowing through the magnetoresistive element.

In any event, the current which is caused to flow through the magnetoresistive element is varied or changed during passage of the protrusions or recessions.

Taking this into consideration, the magnetoresistive element 26 alone may be included in the head unit to detect only the surface roughness. From this fact, it is readily understood that the object to be detected may not always generate a magnetic field.

While this invention has thus far been described in conjunction with a few embodiments thereof, it will be readily understood for those skilled in the art to put this invention into practice in various other manners. For example, this invention may be used to detect recessions or damages on a surface of an object. The object may be also a photomask substrate, a semiconductor wafer, such as a silicon wafer, or the like.

At any rate, the magnetoresistive element is small in size and light in weight, which enables a reduction of a size in a composite magnetic head portion and faithful detection of protrusions, recessions, and damages left on the object. Furthermore, the glide and the certifying tests can be simultaneously carried out by the use of the composite magnetic head portion 20 according to this invention. Consequently, a testing process is remarkably simplified, which serves to save labor for both the glide and the certifying tests.

What is claimed is:

1. A method of detecting a surface roughness on an object which is a selected one of a nonmagnetic medium and a magnetic recording medium, the method comprising the steps of:

placing a motion unit which has a magnetoresistive element with said element adjacent said object;

moving said motion unit along said object to derive an electric signal which is varied due to a mechanical deformation of the magnetoresistive element caused during moving the motion unit along the object; and detecting said surface roughness from said electric signal.

2. A surface roughness detecting method as claimed in claim 1, wherein said object is a magnetic recording medium.

3. A surface roughness detecting method as claimed in claim 1, wherein said object is a semiconductor wafer.

4. A surface roughness detecting method as claimed in claim 1, wherein said object is a photomask blank.

5. A surface roughness detecting method as claimed in claim 1, wherein said magnetoresistive element is of a thin film type.

6. A surface roughness detecting method as claimed in claim 1, further comprising the steps of:

preparing a magnetic recording medium as said object;

providing said motion unit which comprises a head unit operable as both a recording head and a reproducing head including said magnetoresistive element;

putting said recording head into an active state to record a predetermined reference signal on said magnetic recording medium; and reproducing said predetermined reference signal as a reproduced signal from said magnetic recording medium by driving said reproducing head included in the motion unit to produce said electric signal and to detect the surface roughness from said electric signal.

7. A surface roughness detecting device for use in detecting a surface roughness on an object which is a selected one of a nonmagnetic medium and a magnetic recording medium, said detecting device comprising:

a motion unit which is movable along said object and which includes a magnetoresistive element which varies an electric signal due to a mechanical deformation caused during moving the motion unit over the object, to produce said electric signal; and an electric circuit electrically coupled to said magnetoresistive element for detecting the surface roughness from said electric signal.

8. A surface roughness detecting device as claimed in claim 7, wherein said motion unit comprises:

a head unit which includes said magnetoresistive element arranged so that said surface roughness is detected; and a head slider attached to said head unit for moving said head unit along the object surface.

9. A surface roughness detecting device as claimed in claim 8, wherein said object is a magnetic recording medium.

10. A surface roughness detecting device as claimed in claim 9, wherein said head unit comprises:

a recording head portion which includes a core and a coil wound around said core;

a reproducing head portion which is adjacent to said recording head portion and which includes said magnetoresistive element; and an electric circuit connected to said recording head portion and said reproducing head portion for selectively putting said recording and said reproducing head portions into active states and to record and reproduce a predetermined signal on and from said magnetic recording medium, respectively.

11. A surface roughness detecting device as claimed in claim 10, wherein said core of the recording head portion has a magnetic gap directed towards said magnetic recording medium;

said magnetoresistive element being located within said gap to form said reproducing head portion.

12. A surface roughness detecting device as claimed in claim 10, wherein said magnetoresistive element is located between said head slider and said core to form said reproducing head portion.

13. A surface roughness detecting device as claimed in claim 8, wherein said magnetoresistive element comprises:

a magnetoresistive film which has an anisotropic magnetoresistance effect, an axis of easy magnetization, and both end surfaces transverse to the axis of easy magnetization; and element electrodes formed on said end surfaces of the magnetoresistive film and connected to said electric circuit.

14. A surface roughness detecting device as claimed in claim 13, wherein said electric circuit comprises:

a voltage source for supplying a bias voltage across the element electrodes of the magnetoresistive film; and a voltage variation detecting circuit for detecting the electric signal related to the surface roughness.

* * * * *